(12) United States Patent
Choi et al.

(10) Patent No.: US 9,949,358 B2
(45) Date of Patent: Apr. 17, 2018

(54) CIRCUIT BOARD AND DISPLAY DEVICE HAVING THE SAME

(71) Applicant: Samsung Display Co., Ltd., Yongin-Si, Gyeonggi-Do (KR)

(72) Inventors: Siyoung Choi, Asan-si (KR); Moonshik Kang, Yongin-si (KR); Jeonghun Go, Asan-si (KR); Yongsoon Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/224,903

(22) Filed: Aug. 1, 2016

(65) Prior Publication Data

US 2017/0164460 A1   Jun. 8, 2017

(30) Foreign Application Priority Data

Dec. 2, 2015 (KR) .................. 10-2015-0170839

(51) Int. Cl.
*H05K 1/02* (2006.01)
*H05K 1/03* (2006.01)
*H05K 1/18* (2006.01)

(52) U.S. Cl.
CPC ......... *H05K 1/0203* (2013.01); *H05K 1/0298* (2013.01); *H05K 1/0306* (2013.01); *H05K 1/0373* (2013.01); *H05K 1/18* (2013.01); *H05K 2201/062* (2013.01); *H05K 2201/10128* (2013.01)

(58) Field of Classification Search
CPC .. H05K 1/0203; H05K 1/0298; H05K 1/0306; H05K 1/0373; H05K 1/18

USPC .......................................... 361/708
See application file for complete search history.

(56) References Cited

U.S. PATENT DOCUMENTS

| 8,183,574 B2* | 5/2012 | Ferru | H01L 25/167 257/510 |
| 2005/0254215 A1* | 11/2005 | Khbeis | H01L 23/3677 361/704 |
| 2007/0074904 A1* | 4/2007 | Kohara | H05K 3/0055 174/262 |
| 2008/0290514 A1* | 11/2008 | Kim | H01L 21/6835 257/738 |

(Continued)

FOREIGN PATENT DOCUMENTS

| KR | 1020030018520 A | 3/2003 |
| KR | 101049228 B1 | 7/2011 |

(Continued)

OTHER PUBLICATIONS http://www.engineeringtoolbox.com/thermal-conductivity-d_429.html , The egineering toolbox.*

(Continued)

*Primary Examiner* — Dion R Ferguson
*Assistant Examiner* — Mandeep S Buttar
(74) *Attorney, Agent, or Firm* — Cantor Colburn LLP

(57) ABSTRACT

A circuit board includes a base layer, a circuit layer disposed on the base layer, where an air gap is defined in the circuit layer, a heat blocking part disposed in the air gap, and an electronic element disposed on the circuit layer. The heat blocking part has a thermal conductivity lower than a thermal conductivity of the circuit layer.

20 Claims, 10 Drawing Sheets

(56) References Cited

U.S. PATENT DOCUMENTS

| | | | |
|---|---|---|---|
| 2009/0109624 A1* | 4/2009 | Chan | H05K 1/0206 |
| | | | 361/702 |
| 2009/0207568 A1* | 8/2009 | Haveri | H01L 23/473 |
| | | | 361/699 |
| 2015/0075758 A1* | 3/2015 | Ishimaru | F28F 3/048 |
| | | | 165/167 |
| 2017/0123557 A1* | 5/2017 | Na | G06F 3/0412 |

FOREIGN PATENT DOCUMENTS

| | | |
|---|---|---|
| KR | 101211732 B1 | 12/2012 |
| KR | 101254601 B1 | 4/2013 |
| KR | 101263802 B1 | 5/2013 |
| KR | 101403554 B1 | 5/2014 |
| KR | 101457803 B1 | 10/2014 |
| KR | 101469665 B1 | 12/2014 |
| KR | 1020150032972 A | 4/2015 |

OTHER PUBLICATIONS

Ong, et al., Introduction to Thermal Insulating Materials and Silica Aerogels, Elastomers and Composites, vol. 46, No. 1, pp. 29-36 (Mar. 2011).

\* cited by examiner

CIRCUIT BOARD AND DISPLAY DEVICE HAVING THE SAME

This application claims priority to Korean Patent Application No. 10-2015-0170839, filed on Dec. 2, 2015, and all the benefits accruing therefrom under 35 U.S.C. § 119, the content of which in its entirety is herein incorporated by reference.

BACKGROUND

1. Field

The disclosure relates to a circuit board and a display device including the circuit board. More particularly, the disclosure relates to a circuit board that controls heat generated therein and a display device including the circuit board.

2. Description of the Related Art

A circuit board is manufactured by disposing a conductive layer used to form a circuit on an insulating substrate. Electronic elements are mounted on the conductive layer. Electrical signals are applied to each electronic element through the conductive layer. Electrical signals processed and generated by the electronic elements are applied to the other electronic elements or to the outside through the conductive layer. The circuit board drives the electronic elements by using the electrical signals or drives external components connected to the circuit board.

The electronic elements emit heat while being driven. The heat emitted from the electronic elements is transferred to around in the form of radiant heat or in the form of conductive heat transferred through the conductive layer or the insulating substrate.

Meanwhile, the display device displays an image in response to the electrical signals. The display device includes the circuit board generating and controlling the electrical signals and a display panel receiving the electrical signal from the circuit board to display the image. The circuit board and the display panel are accommodated in a predetermined protective member to form the display device. Accordingly, the circuit board is coupled to the display device while being disposed adjacent to the other components.

SUMMARY

The disclosure provides a circuit board capable of reducing influence on external components, which is caused by heat generated from electronic elements.

The disclosure provides a display device including the circuit board.

An embodiment of the inventive concept provides a circuit board including a base layer, a circuit layer disposed on the base layer, where an air gap is defined in the circuit layer, a heat blocking part disposed in the air gap, and an electronic element disposed on the circuit layer. In such an embodiment, the heat blocking part has a thermal conductivity lower than a thermal conductivity of the circuit layer.

In an embodiment, the heat blocking part may include at least one of a glass fiber, a ceramic fiber, a calcium silicate fiber, a cellulose fiber, a polystyrene foam, a rigid urethane foam, a silica aerogel, a polymer aerogel, and an alumina aerogel.

In an embodiment, the heat blocking part may be an air disposed in the air gap.

In an embodiment, the circuit layer may include a plurality of conductive layers and a plurality of insulating layer alternately disposed with the conductive layers.

In an embodiment, the air gap may be defined through at least one layer of the conductive layers and the insulating layers.

In an embodiment, at least one conductive layer of the conductive layers may be disposed between the air gap and the electronic element.

In an embodiment, the circuit board may further include an upper cover layer disposed on the circuit layer and a lower cover layer disposed under the base layer. In such an embodiment, the electronic element may be electrically connected to the circuit layer through an opening defined in the upper cover layer.

In an embodiment, the upper cover layer may include a substantially same material as the base layer.

In an embodiment, the air gap may be defined further through the base layer, and the air gap may be covered by the lower cover layer.

In an embodiment, the thermal conductivity of the heat blocking part may be lower than a thermal conductivity of the base layer.

In an embodiment, a width in a direction of the air gap may be equal to or greater than a width in the direction of the electronic element when viewed in a plan view.

In an embodiment, the air gap may have a cross-sectional area equal to or greater than a cross-sectional area of the electronic element.

In an embodiment, the electronic element may be provided in a plural number, the air gap may be provided in a plural number, and the air gaps correspond to the electronic elements, respectively.

In an embodiment, the electronic element may be provided in a plural number and the air gap may overlap all of the electronic elements when viewed in the plan view.

In an embodiment, the air gap may be filled with the heat blocking part, and a width in a direction of the heat blocking part may be equal to or greater than a sum of widths in the direction of the electronic elements and intervals in the direction between the electronic elements when viewed in the plan view.

An embodiment of the inventive concept provides a display device including a display panel and a circuit board connected to the display panel and including a circuit layer and an electronic element disposed on the circuit layer. In such an embodiment, an air gap is defined in the circuit layer, and the air gap has a cross-sectional area equal to or greater than a cross-sectional area of the electronic element.

In an embodiment, the air gap may be filled with at least one of a glass fiber, a ceramic fiber, a calcium silicate fiber, a cellulose fiber, a polystyrene foam, a rigid urethane foam, a silica aerogel, a polymer aerogel, and an alumina aerogel.

In an embodiment, a width in a direction of the air gap is equal to or greater than a width in the direction of the electronic element when viewed in a plan view.

In an embodiment, the circuit layer may include a plurality of conductive layers and a plurality of insulating layers alternately disposed with the conductive layers, and the air gap may be defined through a conductive layer of the conductive layers and an insulating layer of the insulating layers, which makes contact with the one conductive layer.

In an embodiment, the display device may further include an upper protective member which covers an upper surface of the display panel and a lower protective member which defines an inner space to accommodate the display panel and the circuit board. In such an embodiment, the air gap may overlap the electronic element and the upper protective member when viewed in a plan view.

According to embodiments as described herein, the circuit board blocks the transfer of the heat generated from the electronic element in the thickness direction thereof. Therefore, other elements disposed under the circuit board may be effectively prevented from being damaged due to the heat generated from the electronic element disposed on the circuit board.

In such embodiments, where the display device includes the circuit board, the heat generated by the electronic element may be effectively controlled without using a separate heat discharge member. Thus, a manufacturing cost of the display device may be reduced and a portability of the display device may be improved.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
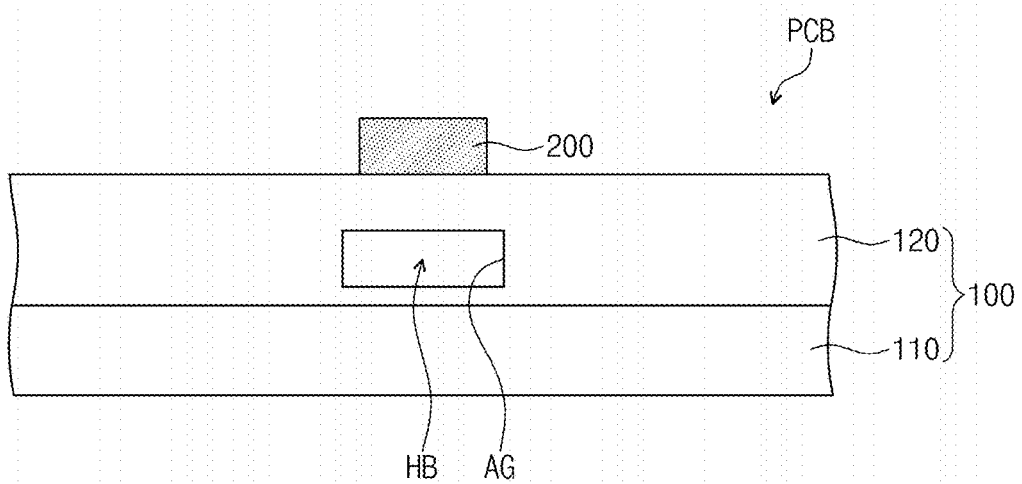
FIG. 1 is a cross-sectional view showing a portion of a circuit board according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

FIG. 1 is a cross-sectional view showing a portion of a circuit board PCB according to an exemplary embodiment of the disclosure. Referring to FIG. 1, an exemplary embodiment of the circuit board PCB includes a substrate 100 and an electronic element 200 disposed on the substrate. The substrate 100 includes a base layer 110 and a circuit layer 120.

The base layer 110 may be, but not limited to, an insulating layer. The base layer 110 insulates the circuit layer 120 from external components and protects the circuit layer 120 disposed thereon. In one exemplary embodiment, for example, the base layer 110 may include plastic, polyester, polyolefin, polyethylene, polypropylene, polyvinyl alcohol, vinyl resin, e.g., polyvinyl chloride ("PVC") or polyvinylidene chloride ("PVDC"), or a mixture thereof.

The circuit layer 120 is disposed on the base layer 110. The circuit layer 120 may include a conductive layer that is patterned. The patterned conductive layer transmits an electrical signal.

The circuit layer 120 may be provided with an air gap AG defined therein. The air gap AG may be defined by an empty space defined in the circuit layer 120, and the air gap AG is spaced apart from the electronic element 200 in a cross-section and overlaps the electronic element 200 when viewed in a plan view, e.g., a plane view in a thickness direction of the circuit board PCB.

The circuit board PCB may further include a heat blocking part HB. The heat blocking part HB is disposed in the air gap AG. The air gap AG is fully or partially filled with the heat blocking part HB. In an exemplary embodiment, the shape and arrangement of the heat blocking part HB are determined based on the air gap AG.

The heat blocking part HB blocks heat emitted from the electronic element 200. The heat emitted from the electronic element 200 is transferred to the substrate 100 to a lower side of the substrate 100. The heat blocking part HB blocks a path through which the heat is transferred from the electronic element 200 to the lower side of the substrate 100, and thus the heat emitted from the electronic element 200 may be effectively prevented from exerting influence on the circuit board PCB.

The heat blocking part HB has a thermal conductivity smaller than that of components disposed adjacent to the air gap AG. Since the heat blocking part HB is defined in the circuit layer 120, the heat blocking part HB may have the thermal conductivity smaller than that of the circuit layer 120. In an exemplary embodiment, where the air gap AG is defined in the base layer 110, the heat blocking part HB may have the thermal conductivity smaller than that of the base layer 110.

The heat blocking part HB may include a variety of materials having low thermal conductivity. In an exemplary embodiment, the heat blocking part HB may be an organic heat insulator or an inorganic heat insulator. In one exemplary embodiment, for example, the heat blocking part HB may include the inorganic heat insulator, such a glass fiber, a ceramic fiber, a calcium silicate fiber, a rock fiber, etc., or the organic heat insulator, such as a cellulose fiber, a polystyrene foam, a urea foam, a phenolic foam, an expanded polystyrene, an expanded polyethylene, a rigid urethane foam, etc.

In one exemplary embodiment, for example, the heat blocking part HB may include an aerogel, such as silica aerogel, polymer aerogel, alumina aerogel, etc. The heat blocking part HB includes a material having low thermal conductivity or has a porous structure, and thus the low thermal conductivity may be realized.

In an exemplary embodiment, the heat blocking part HB may be, but not limited to, defined by an air in the air gap AG. In such an embodiment, the circuit layer 120 may have the same effects as in embodiments where the air gap is defined in the circuit layer 120.

The air has the low thermal conductivity. Generally, the air has the thermal conductivity of about 24 milliwatts per meter-Kelvin (mW/mK). A copper, which may be used as a material for the conductive layer of the circuit layer 120, has the thermal conductivity of about 40,000 mW/mK, and vinyl resin, which may be used as a material for the base layer 110, has the thermal conductivity of about 190 mW/mK. Thus, the circuit board PCB may include the air layer as the heat blocking part HB thereof, as the air may have relatively lower thermal conductivity than that of the other components therein, as described above.

Accordingly, an area of the circuit board PCB, which overlaps the air gap AG receives relatively small influence caused by the heat emitted from the electronic element 200. As the thermal conductivity of the heat blocking part HB filled in the air gap AG becomes low, the heat-blocking effect may be improved. Hereinafter, for the convenience of described, an exemplary embodiment where the air gap AG is filled with the air will be described in detail, but not being limited thereto or thereby.

The electronic element 200 is disposed or mounted on the substrate 100 and electrically connected to the circuit layer 120. The electronic element 200 receives the electrical signals through the circuit layer 120 or applies the electrical signals to the circuit layer 120.

The electronic element 200 is operated in response to the electrical signals and includes an active element and a passive element. In one exemplary embodiment, for example, the electronic element 200 may be a driver integrated circuit ("IC"), a coil, a capacitor, a condenser, a resistor, a transistor, or a light emitting diode.

In such an embodiment, where the electronic element 200 is operated in response to the electrical signals, the electronic element 200 may include complex circuit blocks or components. Therefore, the electronic element 200 emits the heat to the outside while being operated. The heat emitted from the electronic element 200 disposed above the substrate 100 to the substrate 100 may exert influence on the lower side of the substrate 100.

In an exemplary embodiment, the circuit board PCB includes the air gap AG defined in the circuit layer 120 and the low thermal conductivity material filled in the air gap AG and thus the heat emitted from the electronic element 200, which is transferred to the substrate 100, may be blocked. Thus, the influence exerting on the substrate 100, which is caused by the heat emitted from the electronic device 200, may be substantially reduced or effectively prevented.

Figure 2A:
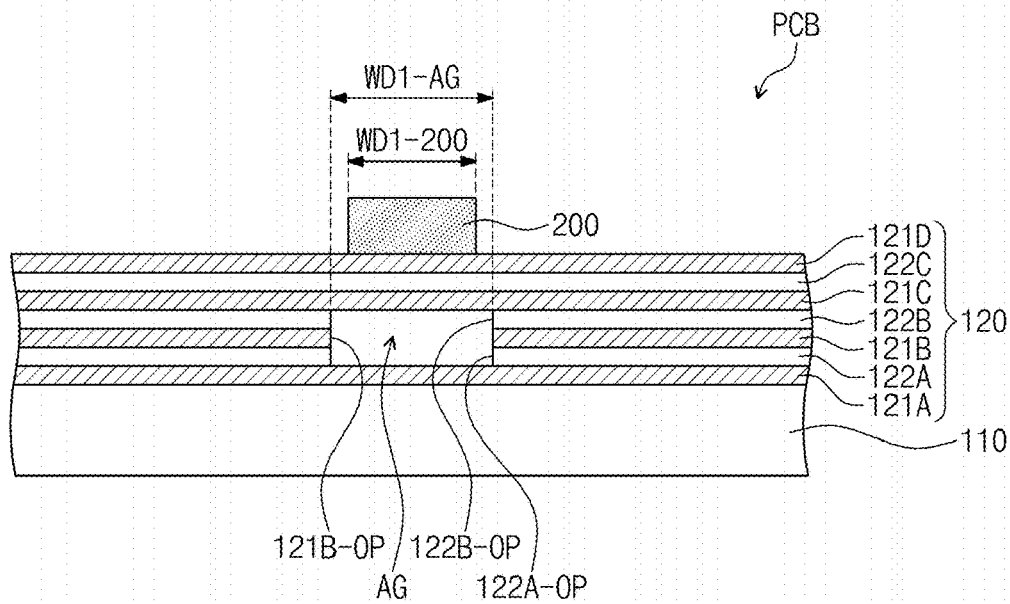
FIG. 2A is a cross-sectional view showing a portion of a circuit board according to an exemplary embodiment of the disclosure.
Figure 2B:
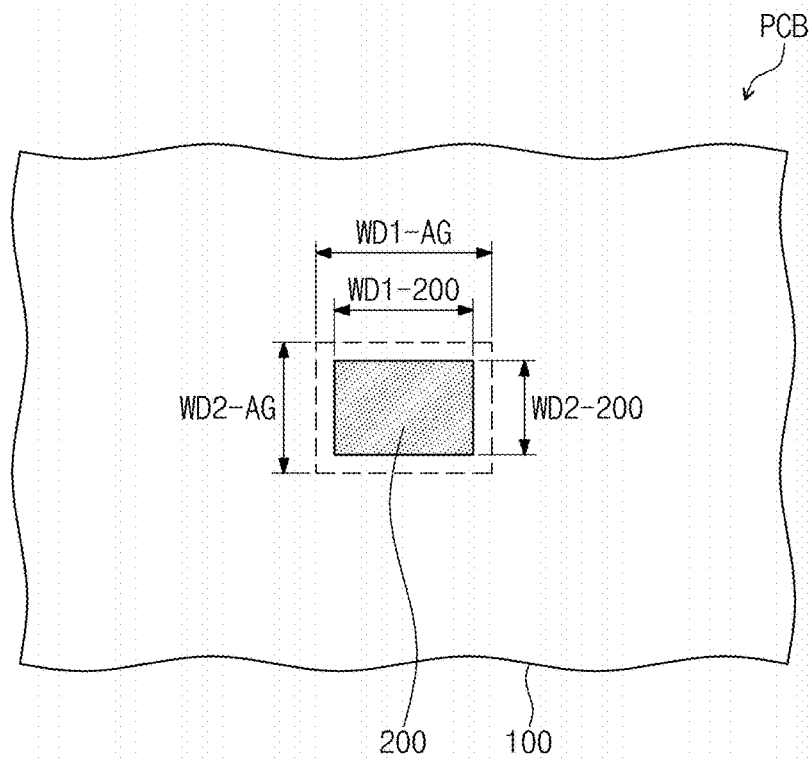
FIG. 2B is a plan view showing a portion of a circuit board according to an exemplary embodiment of the disclosure.
Figure 3:
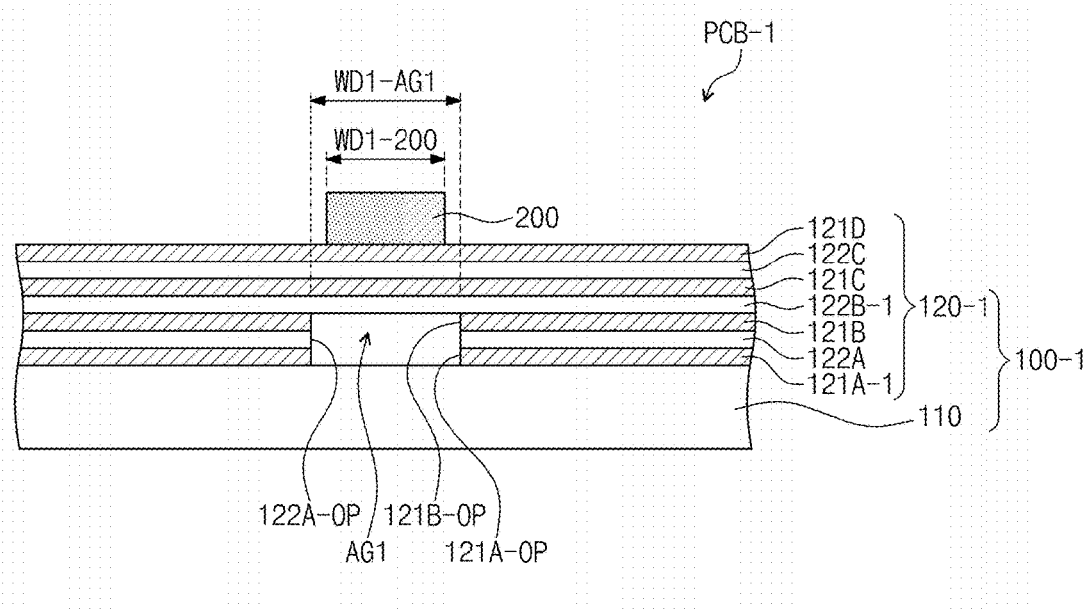
FIG. 3 is a cross-sectional view showing a portion of a circuit board according to an exemplary embodiment of the disclosure.

FIG. 2A is a cross-sectional view showing a portion of a circuit board according to an exemplary embodiment of the disclosure, FIG. 2B is a plan view showing a portion of a circuit board according to an exemplary embodiment of the disclosure, and FIG. 3 is a cross-sectional view showing a portion of a circuit board PCB-1 according to an exemplary embodiment of the disclosure.

For the convenience of illustration, the portion shown in FIG. 3 corresponds to the portion shown in FIG. 2A. In FIGS. 2A, 2B, and 3, the same reference numerals denote the same elements in FIG. 1, and thus any repetitive detailed descriptions of the same elements will hereinafter be omitted.

An exemplary embodiment of the circuit layer 120 includes a plurality of conductive layers 121A, 121B, 121C and 121D and a plurality of insulating layers 122A, 122B, and 122C. In an exemplary embodiment, as shown in FIG. 2A, the conductive layers 121A, 121B, 121C and 121D are alternately disposed, e.g., stacked or arranged, with the insulating layers 122A, 122B and 122C.

Although not shown in figures, the conductive layers 121A, 121B, 121C and 121D may be electrically connected to each other through areas different from each other when viewed in a plan view.

The insulating layers 122A, 122B and 122C insulate the conductive layers 121A, 121B, 121C and 121D from each other in areas except for the areas in which the conductive layers 121A, 121B, 121C and 121D are connected to each other. The insulating layers 122A, 122B and 122C may include at least one of pre-preg, resin, pressure sensitive adhesive, polyester, and polyimide, for example.

In an exemplary embodiment, the conductive layers 121A, 121B, 121C and 121D may include first, second, third and fourth conductive layers 121A, 121B, 121C and 121D, and the insulating layers 122A, 122B and 122C may include first, second and third insulating layers 122A, 122B and 122C.

The air gap AG is defined through at least one layer of the first, second, third and fourth conductive layers 121A, 121B, 121C and 121D, and the first, second and third insulating layers 122A, 122B and 122C. In one exemplary embodiment, for example, as shown in FIG. 2A, the air gap AG is defined through two insulating layers 122A and 122B and one conductive layer 121B.

The second conductive layer 121B is disposed between the first and second insulating layers 122A and 122B. A first opening 122A-OP is defined through the first insulating layer 122A, a second opening 121B-OP is defined through the second conductive layer 121B, and a third opening 122B-OP is defined through the second insulating layer 122B.

The first, second and third openings 122A-OP, 121B-OP and 122B-OP are connected to each other to define the air gap AG. Accordingly, the air gap AG is defined between the first conductive layer 121A and the third conductive layer 121C by the opening defined through the first and second insulating layers 122A and 122B and the second conductive layer 121B and covered by the first conductive layer 121A and the third conductive layer 121C.

In an alternative exemplary embodiment, as shown in FIG. 3, an air gap AG1 may be defined through two conductive layers 121A-1 and 121B-1 and one insulating layer 122A-1 in a substrate 100-1. The first insulating layer 122A-1 is disposed between a first conductive layer 121A-1 and a second conductive layer 121B-1.

A first opening 121A-OP is defined through the first conductive layer 121A-1, a second opening 121B-OP is defined through a first insulating layer 122A-1, and a third opening 122B-OP is defined through the second conductive layer 121B-1. The first, second and third openings 121A-OP, 121B-OP and 122B-OP are connected to each other to define the air gap AG1.

In such an embodiment, the air gap AG1 may correspond to a recessed portion defined by partially removing one side portion (e.g., a lower side portion) of the circuit layer 120-1 and may be defined as the air gap AG1 by the base layer 110 covering the recessed portion. Therefore, the air gap AG1 is defined between the second insulating layer 122B and the base layer 110 and by the opening penetrating through the first and second conductive layers 121A-1 and 121B-1 and the first insulating layer 122A-1 covered by the second insulating layer 122B and the base layer 110. However, in exemplary embodiment, the air gap is not be limited to a specific structure as long as the air gap is defined in the circuit layer 120-1.

Referring back to FIGS. 2A and 3, at least one conductive layer may be disposed between the electronic element 200 and the air gap AG. In an exemplary embodiment, as shown in FIGS. 2A and 3, at least one conductive layer, e.g., the third or fourth conductive layer 121C or 121D, may be disposed between the electronic element 200 and the air gap AG or AG1.

The fourth conductive layer 121D may be directly connected to the electronic element 200 among the first to fourth conductive layers 121A, 121B, 121C and 121D. In an exemplary embodiment, where the element 200 includes a connection part to electrically connected to the circuit board, the connection part may be connected to the fourth conductive layer 121D.

In an exemplary embodiment, where at least the fourth conductive layer 121D is disposed between the electronic element 200 and the air gaps AG and AG1, the electronic element 200 are spaced apart from the air gaps AG and AG1 in a cross-section without making contact with the air gap AG or AG1. The electronic element 200 receives or transmits the electrical signals through the fourth conductive layer 121D, and thus the influence exerting on the electrical driving of the electronic element 200, which is caused by the air gap AG may be reduced.

In such an embodiment, a cross-sectional area of the air gap may be equal to or greater than that of the electronic element 200. The electronic element 200 is disposed in an area overlapping the air gap. Thus, the entire portion of the electronic element 200 may overlap the air gap when viewed in a plan view.

In an exemplary embodiment, where the electronic element 200 has widths measured in a first direction and a second direction different from the first direction, the electronic element 200 may have a width WD1-200 in the first direction and a width WD2-200 in the second direction.

In such an embodiment, a first width WD1-AG1 measured in the first direction of the air gap AG may be equal to or greater than the width WD1-200 in the first direction of the electronic element 200. In such an embodiment, a second width WD2-AG1 measured in the second direction of the air gap AG may be equal to or greater than the width WD2-200 in the second direction of the electronic element 200.

The air gap AG1 shown in FIG. 3 has a width WD1-AG1 equal to or greater than the width WD1-200 in the first direction of the electronic element 200. The cross-sectional area of the air gap AG1 may be equal to or greater than the cross-sectional area of the electronic element 200 regardless of the position on the cross-section of the air gap AG1.

In an exemplary embodiment, where the heat is emitted from the entire area of the electronic element 200, the area of the substrate 100, which overlaps the electronic element 200, may be influenced by the heat emitted from the electronic element 200. Accordingly, the cross-sectional area of the electronic element 200 may correspond to the area to which the heat emitted from the electronic element 200 is transmitted.

In an exemplary embodiment, as described above, the cross-sectional area of the air gap AG may be equal to or greater than the cross-sectional area of the electronic element 200. In such an embodiment, as a ratio of the cross-sectional area of the air gap AG to the cross-sectional area of the electronic element 200 becomes large, the air gap AG may effectively block the heat emitted from the electronic element 200.

In an exemplary embodiment, since the air gap AG is defined in the circuit layer 120, the area of the conductive layers 121A, 121B, 121C and 121D of the circuit layer 120 is reduced when the cross-sectional area of the air gap AG increases, and as a result, a circuit design to drive the electronic element 200 may be influenced. Therefore, the air gap AG which has the cross-sectional area and the shape to have the improved heat blocking effect without exerting influence on the driving of the electronic element 200, may be defined in the circuit board PCB.

Figure 4A:
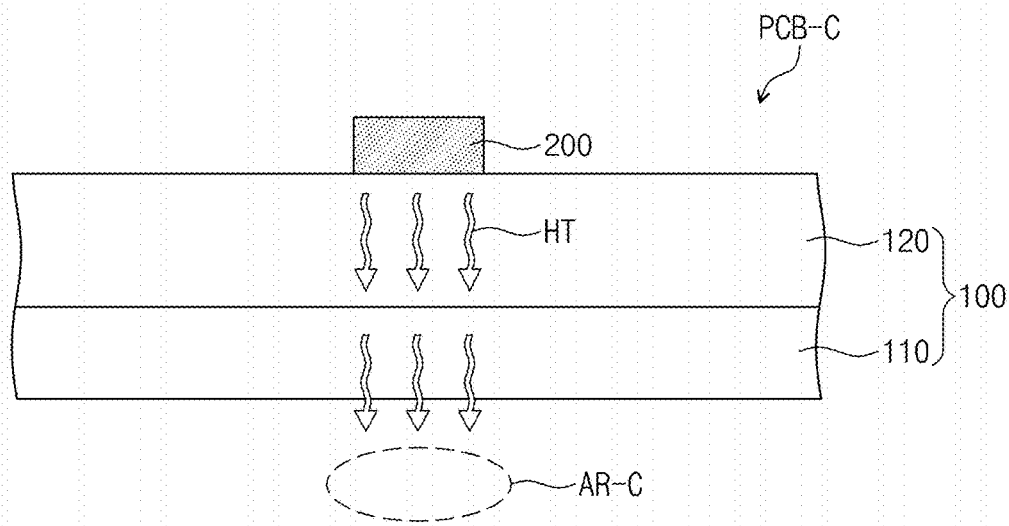
FIG. 4A is a cross-sectional view showing a portion of a circuit board according to a comparison embodiment.
Figure 4B:
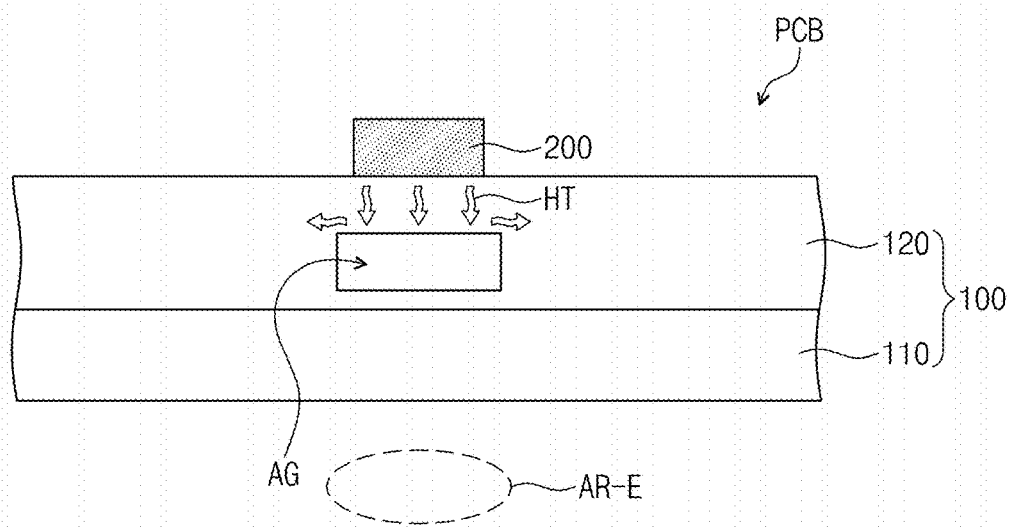
FIG. 4B is a cross-sectional view showing a portion of a circuit board according to an exemplary embodiment of the disclosure.
Figure 5A:
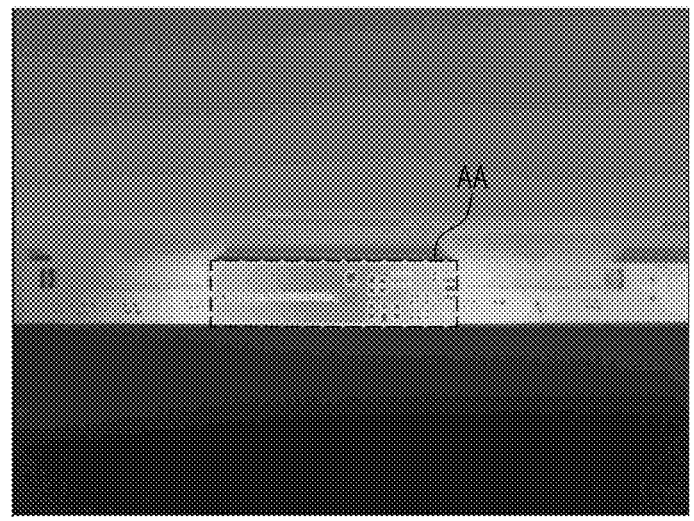
FIG. 5A is a view showing a heat distribution in a circuit board according to a comparison embodiment.
Figure 5B:
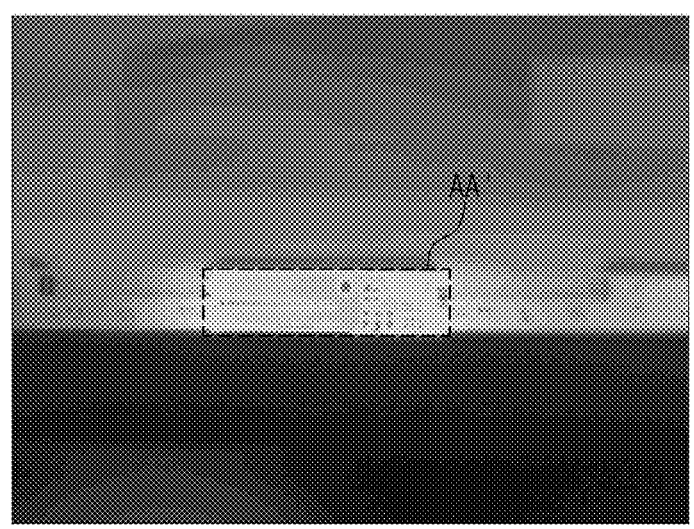
FIG. 5B is a view showing a heat distribution in a circuit board according to an exemplary embodiment of the disclosure.

FIG. 4A is a cross-sectional view showing a portion of a circuit board according to a comparison embodiment, FIG. 4B is a cross-sectional view showing a portion of a circuit board according to an exemplary embodiment of the disclosure, FIG. 5A is a view showing a heat distribution in a circuit board according to a comparison embodiment, and FIG. 5B is a view showing a heat distribution in a circuit board according to an exemplary embodiment of the disclosure.

For the convenience of illustration, FIGS. 4A and 4B show an area corresponding to that shown in FIG. 1. FIG. 5A shows a heat distribution on the plane of the circuit board corresponding to the structure of the circuit board PCB-C shown in FIG. 4A, and FIG. 5B shows a heat distribution on the plane of the circuit board corresponding to the structure of the circuit board PCB shown in FIG. 4B. In FIGS. 4A, 4B, 5A, and 5B, the same reference numerals denote the same elements in FIGS. 1 to 3, and thus any repetitive detailed descriptions of the same elements will hereinafter be omitted.

Referring to FIG. 4A, the air gap AG is not defined in the circuit board PCB-C according to the comparison embodiment. Accordingly, the heat HT emitted from the electronic device 200 is transferred along the circuit layer 120 and the base layer 110 in the form of conductive heat.

The heat HT emitted from the electronic element 200 is transferred to the rear surface of the base layer 110, and then is transferred to the outside of the substrate 100 in the form of radiant heat. Therefore, a lower side AR-C of the circuit board PCB-C may be influence by the heat HT emitted from the electronic element 200 disposed above the base layer 110.

As shown in FIG. 5A, the area AA in which the electronic element 200 is disposed is shown in a dark gray color due to the heat generated by the electronic element 200. The area AA may correspond to the lower side AR-C of the circuit board PCB-C shown in FIG. 4A.

As shown in FIG. 5A, the heat generated by the electronic element 200 may not be discharged to the outside of the circuit board PCB-C and may deteriorate the electronic element 200 or the circuit layer 120 of the circuit board PCB-C.

In an exemplary embodiment, as shown in FIG. 4B, the circuit board PCB includes the air gap AG defined therein. In such an embodiment, as described above, the air gap AG is filled with the air or the heat blocking material having the low thermal conductivity.

In such an embodiment, the heat HT emitted from the electronic element 200 is transferred to the circuit layer 120 and blocked by the air gap AG. The heat HT emitted from the electronic element 200 may not be transferred to upward and downward directions and may be transferred to around the air gap AG.

The conduction path of the heat HT is changed to a left-and-right direction from the up-and-down direction by the air gap AG. Accordingly, the influence, which is exerted on a lower side of the circuit board PCB and caused by the heat HT emitted from the electronic element 200, may be reduced.

In an exemplary embodiment, the circuit board PCB may reduce the influence exerted on the outside of the circuit board PCB due to the electronic element 200 since the air gap AG is defined in the circuit board PCB. Therefore, although additional external elements are disposed under the circuit board PCB, the external elements may be effectively prevented from being damaged due to the heat generated by the electronic element 200.

As shown in FIG. 5B, the area AA' in which the electronic element 200 is disposed is shown in a light gray color due to the heat generated by the electronic element 200. The area AA' may correspond to the lower side AR-E of the circuit board PCB shown in FIG. 4B.

In FIGS. 5A and 5B, the light gray color represents a relatively lower temperature than that of the dark gray color. In an exemplary embodiment, the circuit board PCB blocks the heat path to the circuit board PCB using the air gap AG defined in the circuit board PCB, and thus the circuit board PCB and the electronic element 200 may be effectively prevented from being deteriorated.

Figure 6:
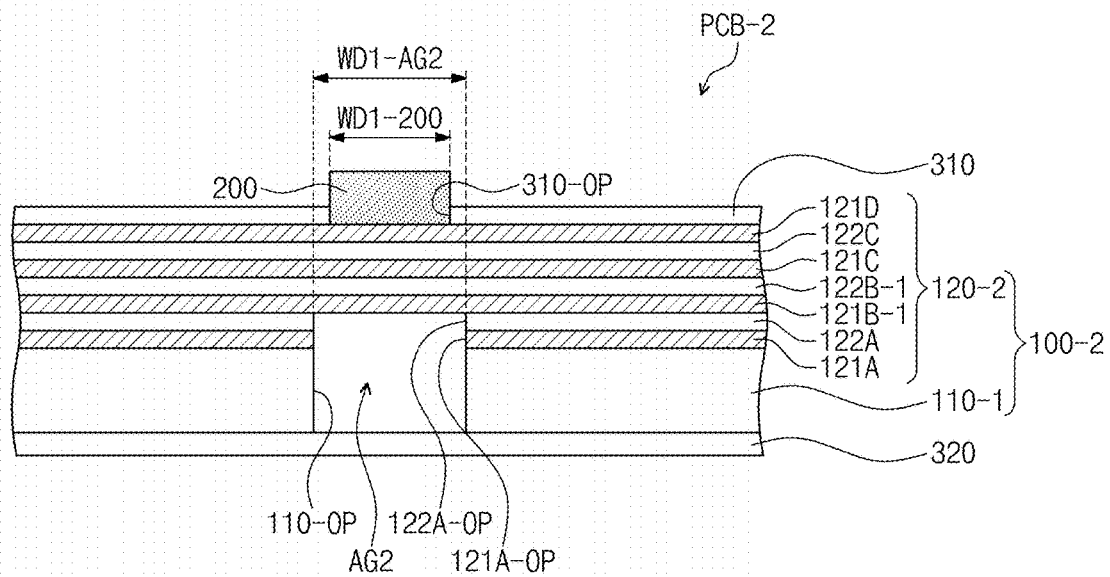
FIG. 6 is a cross-sectional view showing a portion of a circuit board according to an exemplary embodiment of the disclosure.

FIG. 6 is a cross-sectional view showing a portion of a circuit board PCB-2 according to an exemplary embodiment of the disclosure. The portion of the circuit board PCB-2 shown in FIG. 6 corresponds to the portion of the circuit board PCB shown in FIG. 2A. In FIG. 6, the same reference numerals denote the same elements in FIGS. 1 to 5B, and thus any repetitive detailed descriptions of the same elements will hereinafter be omitted.

Referring to FIG. 6, in an exemplary embodiment, the circuit board PCB-2 may include a substrate 100-2 and the electrode 200, and further include an upper cover layer 310 and a lower cover layer 320. The substrate 100-2 may include a base layer 110-1 and a circuit layer 120-2. The upper cover layer 310 may be disposed on the circuit layer 120-2 to cover the fourth conductive layer 121D.

The upper cover layer 310 is provided with an opening 310-OP defined or formed therethrough. The electronic element 200 makes contact with the circuit layer 120-2 through the opening 310-OP of the upper cover layer 310 disposed on the circuit layer 120-2. The upper cover layer 310 may effectively prevent other elements disposed on the circuit layer 120-2 and the circuit board PCB-2 from electrically interfering with each other and protects the circuit layer 120-2.

The upper cover layer 310 may include the same material as the base layer 110-1. In one exemplary embodiment, for example, the upper cover layer 310 may include plastic, polyester, polyolefin, polyethylene, polypropylene, polyvinyl alcohol, vinyl resin (e.g., PVC or PVDC), or a mixture thereof.

The lower cover layer 320 may be disposed below the base layer 110-1. The lower cover layer 320 covers a solder resist layer or other conductive materials, which are exposed on the rear surface of the base layer 110-1. Although not shown in figures, a pressure sensitive adhesive may be further disposed between the lower cover layer 320 and the base layer 110-1.

In such an embodiment, the air gap AG2 of the circuit board PCB-2 may be defined through the first conductive layer 121A-1, the first insulating layer 122A-1, and the base layer 110-1. Accordingly, the air gap AG2 is defined between the second conductive layer 121B-1 and the lower cover layer 320 by the opening defined through the first insulating layer 121A-1, the first conductive layer 122A-1, and the base layer 110-1 and covered by the second conductive layer 121B-1 and the lower cover layer 320.

The air gap AG2 further penetrates the base layer 110-1, and thus the air gap AG2 may be defined at the outermost layer of the circuit board PCB-2. Accordingly, elements disposed adjacent to the lower cover layer 320 may be effectively protected from the heat generated by the electronic element 200 by the air gap AG.

Figure 7:
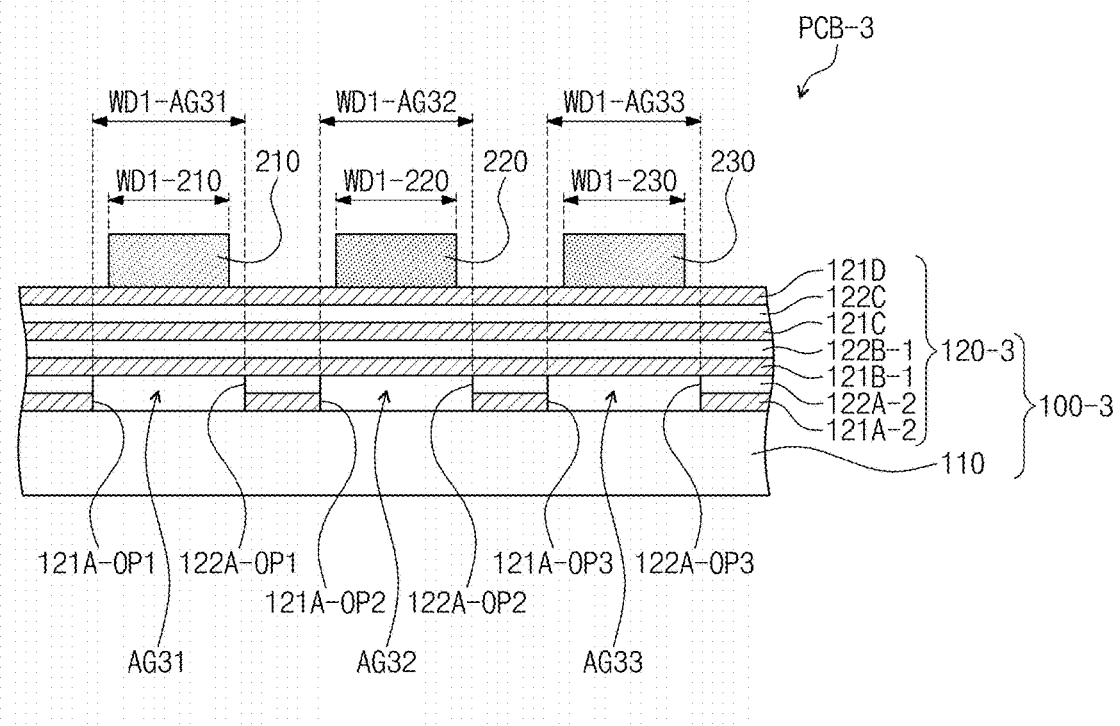
FIG. 7 is a cross-sectional view showing a portion of a circuit board according to an exemplary embodiment of the disclosure.
Figure 8A:
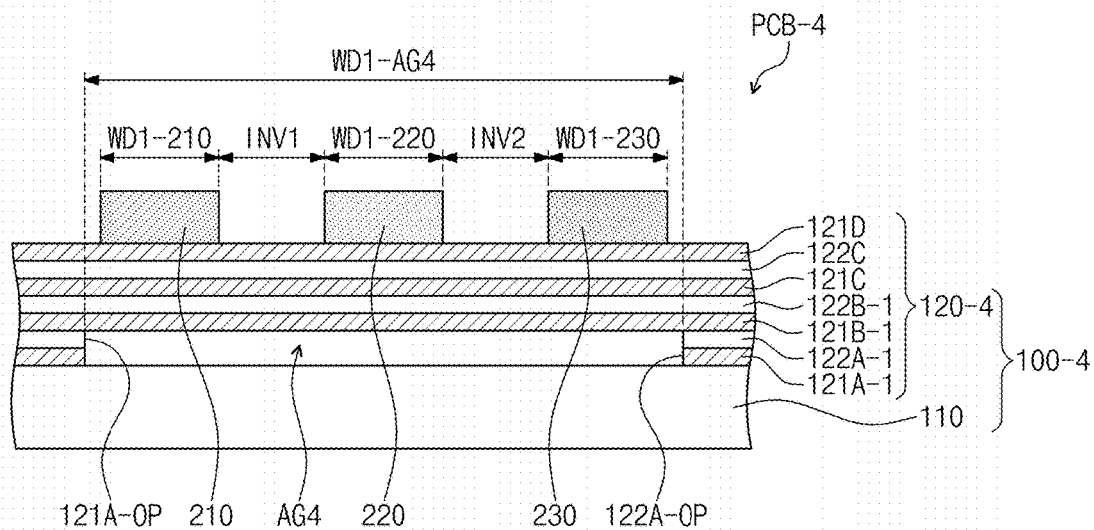
FIG. 8A is a cross-sectional view showing a portion of a circuit board according to an exemplary embodiment of the disclosure.
Figure 8B:
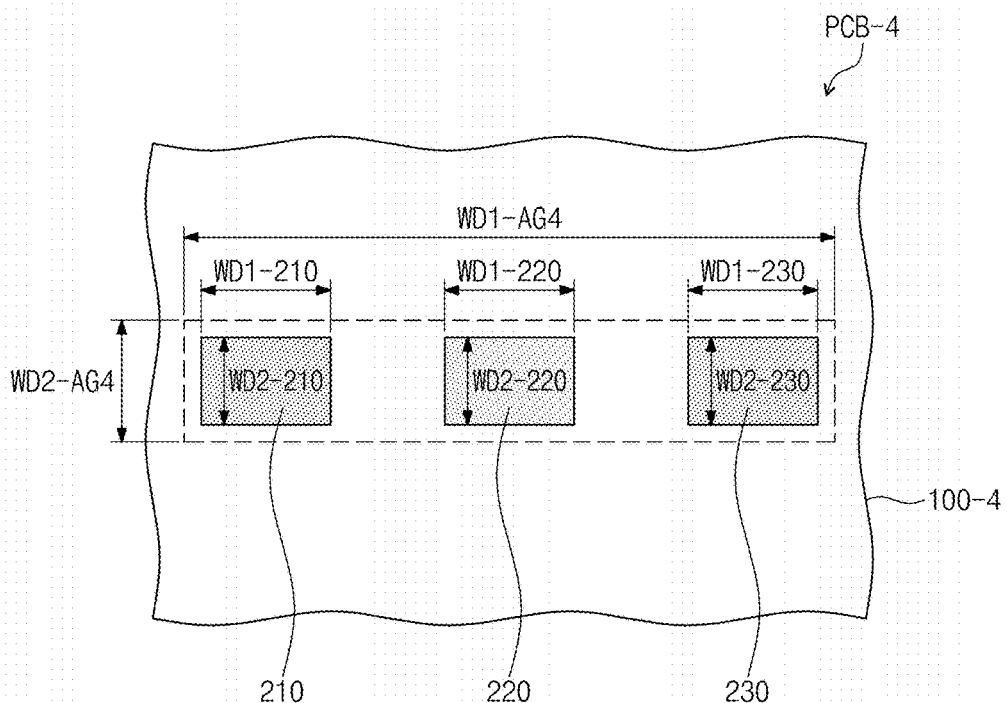
FIG. 8B is a cross-sectional view showing a portion of the circuit board shown in FIG. 8A.

FIG. 7 is a cross-sectional view showing a portion of a circuit board PCB-3 according to an exemplary embodiment of the disclosure, FIG. 8A is a cross-sectional view showing a portion of a circuit board PCB-4 according to an exemplary embodiment of the disclosure, and FIG. 8B is a cross-sectional view showing a portion of the circuit board PCB-4 shown in FIG. 8A.

For the convenience of illustration, the portions shown in FIGS. 7 and 8A correspond to the portions shown in FIG. 2A. In FIGS. 7 to 8A, the same reference numerals denote the same elements in FIGS. 1 to 6, and thus any repetitive detailed descriptions of the same elements will hereinafter be omitted.

Referring to FIGS. 7 to 8B, the electronic element may be provided in a plural number. In an exemplary embodiment, the electronic elements may include first, second and third electronic devices 210, 220 and 230.

In such an embodiment, as shown in FIG. 7, the circuit board PCB-3 may include a substrate 100-3 and the first, second and third electronic elements 210, 220 and 230. The substrate 100-3 may include the base layer 110 corresponding to the base layer 110 in FIG. 2a, and a circuit layer 120-3.

The first, second and third air gaps AG31, AG32, and AG33 are defined in the circuit board PCB-3 to correspond to the first, second and third electronic elements 210, 220 and 230, respectively.

In an exemplary embodiment, as shown in FIG. 7, the first, second and third air gaps AG31, AG32 and AG33 may be defined in the same layer, but not being limited thereto. In an alternative exemplary embodiment, the first, second and third air gaps AG31, AG32 and AG33 may be defined through different layers from each other.

The first, second and third air gaps AG31, AG32 and AG33 may be defined through a first conductive layer 121A-2 and a first insulating layer 122A-2 of the circuit layer 120-3. Accordingly, the first, second and third air gaps AG31, AG32 and AG33 are defined by covering a plurality of openings 121A-OP1, 121A-OP2 and 121A-OP3 defined through the first conductive layer 121A-2 with a second conductive layer 121B and covering a plurality of openings 122A-OP1, 122A-OP2 and 122A-OP3 defined through the first insulating layer 122A-2 with the base layer 110.

In an exemplary embodiment, each of the first, second and third air gaps AG31, AG32 and AG33 has a cross-sectional area equal to or greater than a cross-sectional area of each of the first, second, and third electronic elements 210, 220, and 230. In such an embodiment, widths WD1-AG31, WD1-AG32, and WD1-AG33 in a direction of the first, second, and third air gaps AG31, AG32, and AG33 are equal to or greater than widths WD1-210, WD1-220, and WD2-230 in the direction of the first, second, and third electronic elements 210, 220, and 230, respectively.

In such an embodiment, as described above, the air gaps AG31, AG32, and AG33 are defined in the circuit board PCB-3, such that the heat generated by each of the electronic elements 210, 220, and 230 may be effectively blocked.

In an alternative exemplary embodiment, as shown in FIGS. 8A and 8B, the circuit board PCB-4 may include a substrate 100-4 and the first, second and third electronic elements 210, 220 and 230. The substrate 100-4 may include a circuit layer 120-4 different from the circuit layer 120-3 in FIG. 7.

A single air gap AG4 is defined in the circuit board PCB-4 and overlaps the first, second and third electronic elements 210, 220, and 230. Similar to the air gaps AG31, AG32, and AG33 shown in FIG. 7, the air gap AG4 is defined by covering the opening 121A-OP defined through the first conductive layer 121A-1 of the circuit layer 120-3 and the opening 122A-OP2 defined through the first insulating layer 122A-1 of the circuit layer 120-3 with the second conductive layer 121B and the base layer 110.

In such an embodiment, the cross-sectional area of the air gap AG4 may be greater than a sum of cross-sectional areas of the first, second, and third electronic elements 210, 220 and 230. In such an embodiment, a first width WD1-AG4 of the air gap AG4 may be greater than or equal to a sum of widths WD1-210, WD1-220 and WD1-230 in the first direction of the first, second and third electronic elements 210, 220 and 230, and intervals INV1 and INV2 between the first, second, and third electronic elements 210, 220, and 230.

Since the first, second and third electronic elements 210, 220 and 230 are aligned linearly along the first direction, a second width WD2-AG4 of the air gap AG4 may be equal to or greater than a maximum length among widths WD2-210, WD2-220 and WD2-230 in the second direction of the first, second and third electronic elements 210, 220 and 230.

In an exemplary embodiment, where the first, second and third electronic elements 210, 220 and 230 are randomly aligned in the first direction, the second width WD2-AG4 of the air gap AG4 may be determined based on the widths WD2-210, WD2-220 and WD2-230 in the second direction of the first, second and third electronic elements 210, 220 and 230, and the intervals in the second direction of the first, second and third electronic elements 210, 220 and 230.

The cross-sectional area of the air gap AG4 and the width of the air gap AG4 in the a direction may be variously modified as long as all electronic elements are disposed entirely in the area corresponding to the air gap AG4 when viewed from a plan view, and thus the air gap AG4 are not particularly limited.

According to exemplary embodiments, since the circuit board includes the predetermined air gap defined therein, the transfer of the heat generated by the electronic element may be effectively blocked without using an additional heat discharge device. In such embodiments, the circuit board may effectively block the transfer of the heat generated by the integrated circuit including the electronic elements in the upward and downward directions, and thus the circuit board and the electronic elements disposed adjacent to the circuit board may be effectively prevented from being damaged due to the heat.

Figure 9:
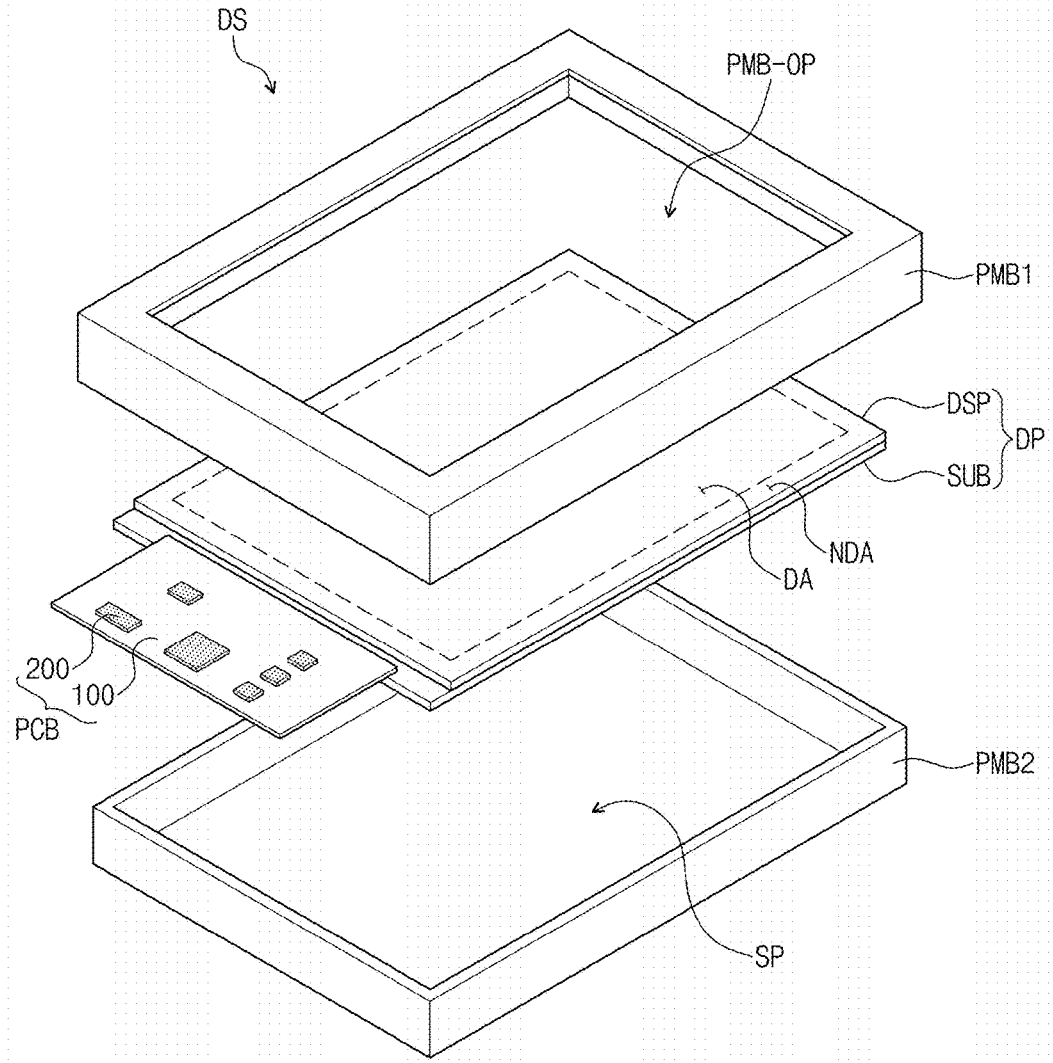
FIG. 9 is an exploded perspective view showing a display device according to an exemplary embodiment of the disclosure.
Figure 10A:
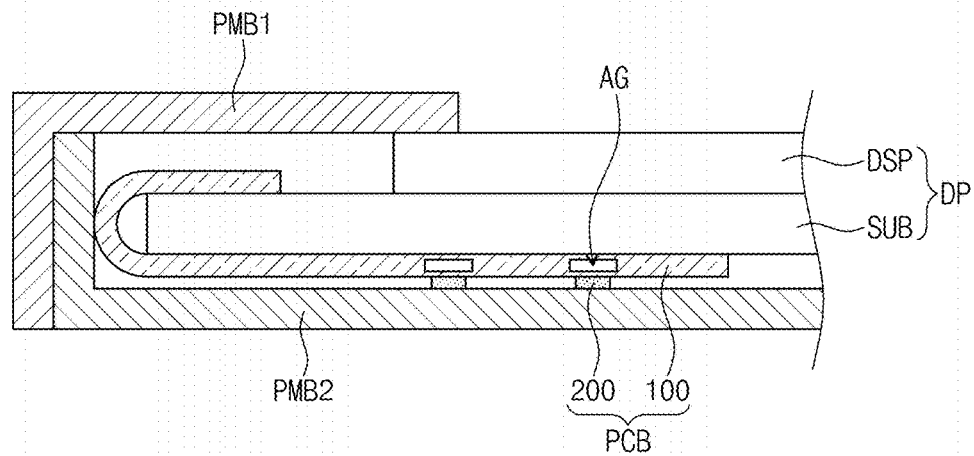
FIG. 10A is a cross-sectional view showing a portion of the display device shown in FIG. 9.
Figure 10B:
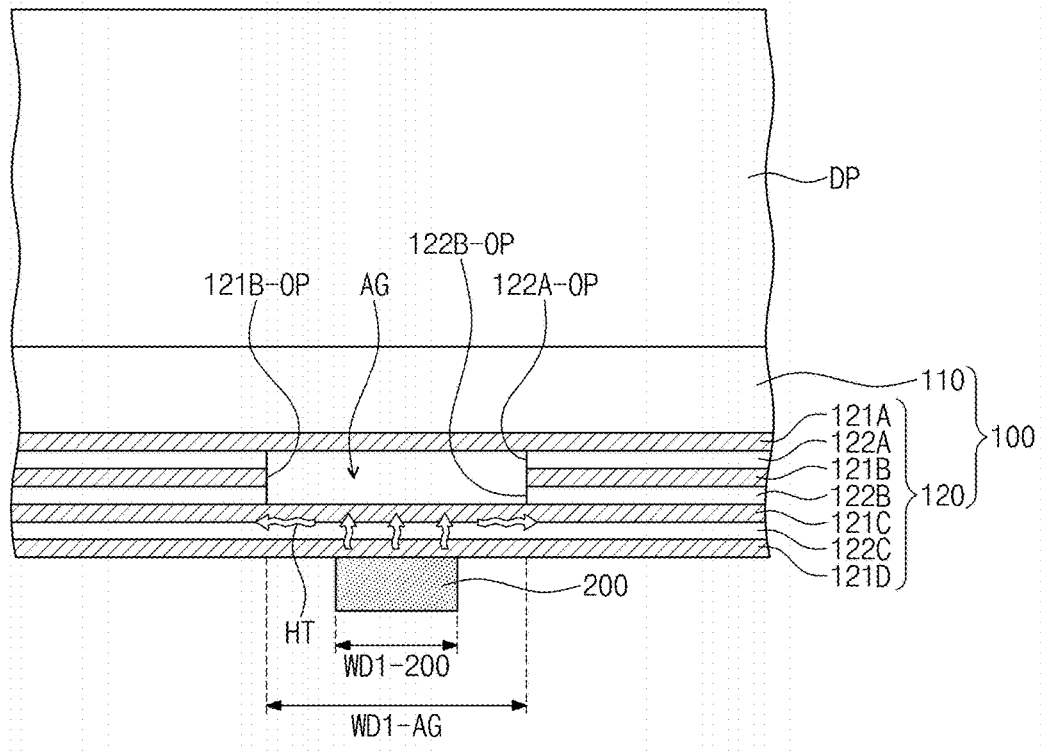
FIG. 10B is a partially enlarged cross-sectional view showing a portion of the display device shown in FIG. 10A.
Figure 11:
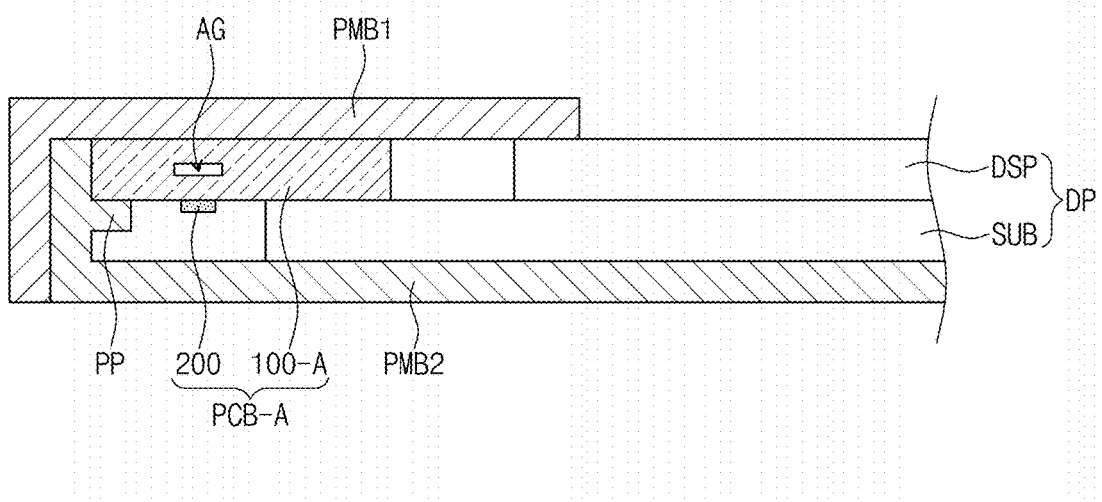
FIG. 11 is a cross-sectional view showing a portion of the display device according to an exemplary embodiment of the disclosure.

FIG. 9 is an exploded perspective view showing a display device DS according to an exemplary embodiment of the disclosure, FIG. 10A is a cross-sectional view showing a portion of the display device DS shown in FIG. 9, FIG. 10B is a partially enlarged cross-sectional view showing a portion of the display device DS shown in FIG. 10A, and FIG. 11 is a cross-sectional view showing a portion of the display device according to an exemplary embodiment of the disclosure.

Hereinafter, an exemplary embodiment of the display device DS will be described in detail with reference to FIGS. 9 to 11. In FIGS. 9 to 11, the same reference numerals denote the same elements in FIGS. 1 to 8B, and thus any repetitive detailed descriptions of the same elements will hereinafter be omitted.

In an exemplary embodiment, the display device DS includes a display panel DP, a circuit board PCB, and a plurality of protective members PMB1 and PMB2. The protective members PMB1 and PMB2 include an upper protective member PMB1 and a lower protective member PMB2.

The display panel DP includes a substrate part SUB and a display part DSP. The substrate part SUB corresponds to a base part to form the display part DSP and supports the display part DSP. The substrate part SUB may be, but not limited to, a glass substrate, a silicon substrate, or a plastic substrate.

The display part DSP is disposed on the substrate part SUB. Although not shown in figures, the display part DSP includes a plurality of signal lines and a plurality of pixels connected to the signal lines. The pixels receive electrical signals through the signal lines and display images corresponding to the electrical signals.

Each of the pixels includes a thin film transistor and a display element connected to the thin film transistor. The display element may include a liquid crystal capacitor, an organic light emitting element, an electrophoretic element, or a conductive ink layer, but not being limited thereto or thereby.

The upper protective member PMB1 covers the display panel DP and the circuit board PCB. The upper protective member PMB1 is provided with a predetermined opening PMB1-OP defined therein. A viewer or a user recognizes the image displayed in the display panel DP through the opening PMB1.

The lower protective member PMB2 provides a predetermined inner space. The display panel DP and the circuit board PCB are accommodated in the inner space. The lower protective member PMB2 and the upper protective member PMB1 are coupled to each other to determine an outer appearance of the display device DS and to protect the display panel DP and the circuit board PCB.

In an exemplary embodiment, the circuit board PCB may be provided in various shapes in the display device DS. In one exemplary embodiment, for example, as shown in FIG. 10A, the circuit board PCB may be accommodated in the inner space to make contact with the rear surface of the display panel DP.

Although not shown in figures, a predetermined flexible circuit board may be further disposed between the circuit board PCB and the display panel DP. An end of the flexible circuit board is connected to the display panel DP, and an opposing end of the flexible circuit board is connected to the circuit board PCB, and thus the display panel DP is coupled to the circuit board PCB.

In an exemplary embodiment, the flexible circuit board is bent, such that the circuit board PCB may be easily disposed on the rear surface of the display panel DP. In an exemplary embodiment where the circuit board PCB is provided in the shape as shown in FIG. 10A, the display device DS may have a relatively slim bezel.

In such an embodiment, as shown in FIG. 10B, the display panel DP is disposed on the circuit board PCB. The air gap AG is defined in the circuit layer 120 of the circuit board PCB.

The air gap AG is defined to overlap the electronic element 200 and the display panel DP when viewed in a plan view. The heat generated by the electronic element 200 disposed or mounted on the circuit board PCB may be transferred through the substrate 100 as the conductive heat, but the air gap AG blocks the transfer of the conductive heat in upward and downward directions.

In such an embodiment, where the display panel DP makes contact with the circuit board PCB, the display panel DP is effectively prevented from being influenced by the heat generated by the electronic element 200. Accordingly, the display panel DP may be effectively prevented from being damaged during use, and thus reliability of the display device DS may be improved.

In an alternative exemplary embodiment, the circuit board PCB-A may be assembled with the display panel DP while being connected to the display panel DP, as shown FIG. 11. In such an embodiment, the circuit board PCB-A may be directly connected to the display panel DP through an upper surface of the substrate 100-A.

A surface of the substrate 100-A which contacts to the display panel DP may be same as a surface of the substrate 100-A on which the electronic element 200 is mounted. Thus, an upper portion of the circuit board PCB, on which the electronic element 200 is mounted, may be disposed to face a lower side of the display panel DP.

The circuit board PCB may directly make contact with a side portion of the display panel DP. Therefore, each of the lower protective member PMB2 and the upper protective member PMB1 respectively make contact with upper and lower side portions of the display panel DP.

In such an embodiment, the lower protective member PMB2 may further include a predetermined protrusion PP to support the circuit board PCB-A. In such an embodiment where the circuit board PCB-A is assembled as shown in FIG. 11, the display device DS may have relatively slim thickness.

In such an embodiment, the lower side of the circuit board PCB-A may faces the upper protective member PMB1 and makes contact with the upper protective member PMB1. Accordingly, the upper protective member PMB1 may be influenced by the heat generated from the electronic element 200.

The upper protective member PMB1 corresponds to a front surface of the display device DS, and thus the user's touch or contact frequently occurs on the upper protective member PMB1. As shown in FIG. 11, the air gap AG is disposed between the electronic element 200 and the upper protective member PMB1 and to overlap the electronic element and the upper protective member PMB1.

In an exemplary embodiment, the display device DS includes the circuit board PCB-A in which the air gap AG is defined, the influence exerting on the upper protective member PMB1 due to the heat from the electronic element 200 may be reduced even though separate heat discharge member is not provided in the display device DS.

Although some exemplary embodiments of the invention have been described herein, it is understood that the invention are not limited to such exemplary embodiments, but various changes and modifications may be made by one ordinary skilled in the art within the spirit and scope of the invention as hereinafter claimed.

What is claimed is:

1. A circuit board comprising:
   a base layer;
   a circuit layer disposed on the base layer, wherein an air gap is defined in the circuit layer;
   a heat blocking part disposed in the air gap; and
   an electronic element disposed on the circuit layer,
   wherein the heat blocking part has a thermal conductivity lower than a thermal conductivity of the circuit layer, and
   wherein an entire portion of the electronic element is between the air gap when viewed in a plan view.

2. The circuit board of claim 1, wherein the heat blocking part comprises at least one of a glass fiber, a ceramic fiber, a calcium silicate fiber, a cellulose fiber, a polystyrene foam, a rigid urethane foam, a silica aerogel, a polymer aerogel and an alumina aerogel.

3. The circuit board of claim 1, wherein the heat blocking part is an air disposed in the air gap.

4. The circuit board of claim 1, wherein the circuit layer comprises:
   a plurality of conductive layers; and
   a plurality of insulating layer alternately disposed with the conductive layers.

5. The circuit board of claim 4, wherein the air gap is defined through at least one layer of the conductive layers and the insulating layers.

6. The circuit board of claim 5, wherein a conductive layer of the conductive layers is disposed between the air gap and the electronic element.

7. The circuit board of claim 1, further comprising:
   an upper cover layer disposed on the circuit layer; and
   a lower cover layer disposed under the base layer,
   wherein the electronic element is electrically connected to the circuit layer through an opening defined in the upper cover layer.

8. The circuit board of claim 7, wherein the upper cover layer comprises a substantially same material as the base layer.

9. The circuit board of claim 8, wherein
   the air gap is defined further through the base layer, and
   the air gap is covered by the lower cover layer.

10. The circuit board of claim 9, wherein the thermal conductivity of the heat blocking part is lower than a thermal conductivity of the base layer.

11. The circuit board of claim 1, wherein a width in a direction of the air gap is equal to or greater than a width in the direction of the electronic element when viewed in the plan view.

12. The circuit board of claim 11, wherein the air gap has a cross-sectional area equal to or greater than a cross-sectional area of the electronic element.

13. The circuit board of claim 11, wherein
   the electronic element is provided in a plural number,
   the air gap is provided in a plural number, and
   the air gaps correspond to the electronic elements, respectively.

14. The circuit board of claim 11, wherein
   the electronic element is provided in a plural number, and
   the air gap overlaps all of the plurality of electronic elements when viewed in the plan view.

15. The circuit board of claim 14, wherein
   the air gap is fully filled with the heat blocking part, and
   a width in a direction of the heat blocking part is equal to or greater than a sum of widths in the direction of the electronic elements and intervals in the direction between the electronic elements when viewed in the plan view.

16. A display device comprising:
   a display panel; and
   a circuit board connected to the display panel and comprising a circuit layer and an electronic element disposed on the circuit layer,
   wherein an air gap is defined in the circuit layer, and
   the air gap has a cross-sectional area equal to or greater than a cross-sectional area of the electronic element, and
   wherein an entire portion of the electronic element is between the air gap when viewed in a plan view.

17. The display device of claim 16, wherein the air gap is filled with at least one of a glass fiber, a ceramic fiber, a calcium silicate fiber, a cellulose fiber, a polystyrene foam, a rigid urethane foam, a silica aerogel, a polymer aerogel and an alumina aerogel.

18. The display device of claim 17, wherein a width in a direction of the air gap is equal to or greater than a width in the direction of the electronic element when viewed in the plan view.

19. The display device of claim 16, wherein
   the circuit layer comprises:
      a plurality of conductive layers; and
      a plurality of insulating layers alternately disposed with the conductive layers, and
   the air gap is defined through a conductive layer of the conductive layers and an insulating layer of the insulating layers, which makes contact with the conductive layer.

20. The display device of claim 16, further comprising:
   an upper protective member which covers an upper surface of the display panel; and
   a lower protective member which defines an inner space to accommodate the display panel and the circuit board,
   wherein the air gap is between the electronic element and the upper protective member in a thickness direction of the display panel.

* * * * *